(12) United States Patent
Tunaboylu

(10) Patent No.: US 8,058,887 B2
(45) Date of Patent: Nov. 15, 2011

(54) PROBE CARD ASSEMBLY WITH INTERPOSER PROBES

(75) Inventor: Bahadir Tunaboylu, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 340 days.

(21) Appl. No.: 12/018,345

(22) Filed: Jan. 23, 2008

(65) Prior Publication Data

US 2009/0184725 A1      Jul. 23, 2009

(51) Int. Cl.
*G01R 31/00* (2006.01)
(52) U.S. Cl. ......... 324/754.18; 324/754.03; 324/754.11; 324/500
(58) Field of Classification Search ............... 324/158.1, 324/750–758; 361/774; 29/831; 439/65–72, 439/78, 83
See application file for complete search history.

(56) References Cited

U.S. PATENT DOCUMENTS 6,482,013 B2 * 11/2002 Eldridge et al. ................. 439/66
7,579,856 B2 * 8/2009 Khandros et al. ............. 324/762

* cited by examiner

*Primary Examiner* — Jermele M Hollington
*Assistant Examiner* — Trung Q Nguyen
(74) *Attorney, Agent, or Firm* — Hickman Palermo Truong & Becker LLP; Edward A. Becker

(57) ABSTRACT

A probe test card assembly for testing a device under test includes interposer probes to connect a printed circuit board to a substrate. The probe test card assembly includes a printed circuit board, a substrate and a substrate holder. A plurality of test probes is connected to the substrate for making electrical contact with the device under test. A plurality of interposer probes is attached to the substrate for providing electrical connections between the substrate and the printed circuit board. The substrate holder holds the substrate in position with respect to the printed circuit board so that the interposer probes contact the printed circuit board. The interposer probes may be arranged in interposer probe groups to facilitate maintenance and replacement of the interposer probes. Hardstop elements may also be used to protect the interposer probes.

20 Claims, 5 Drawing Sheets

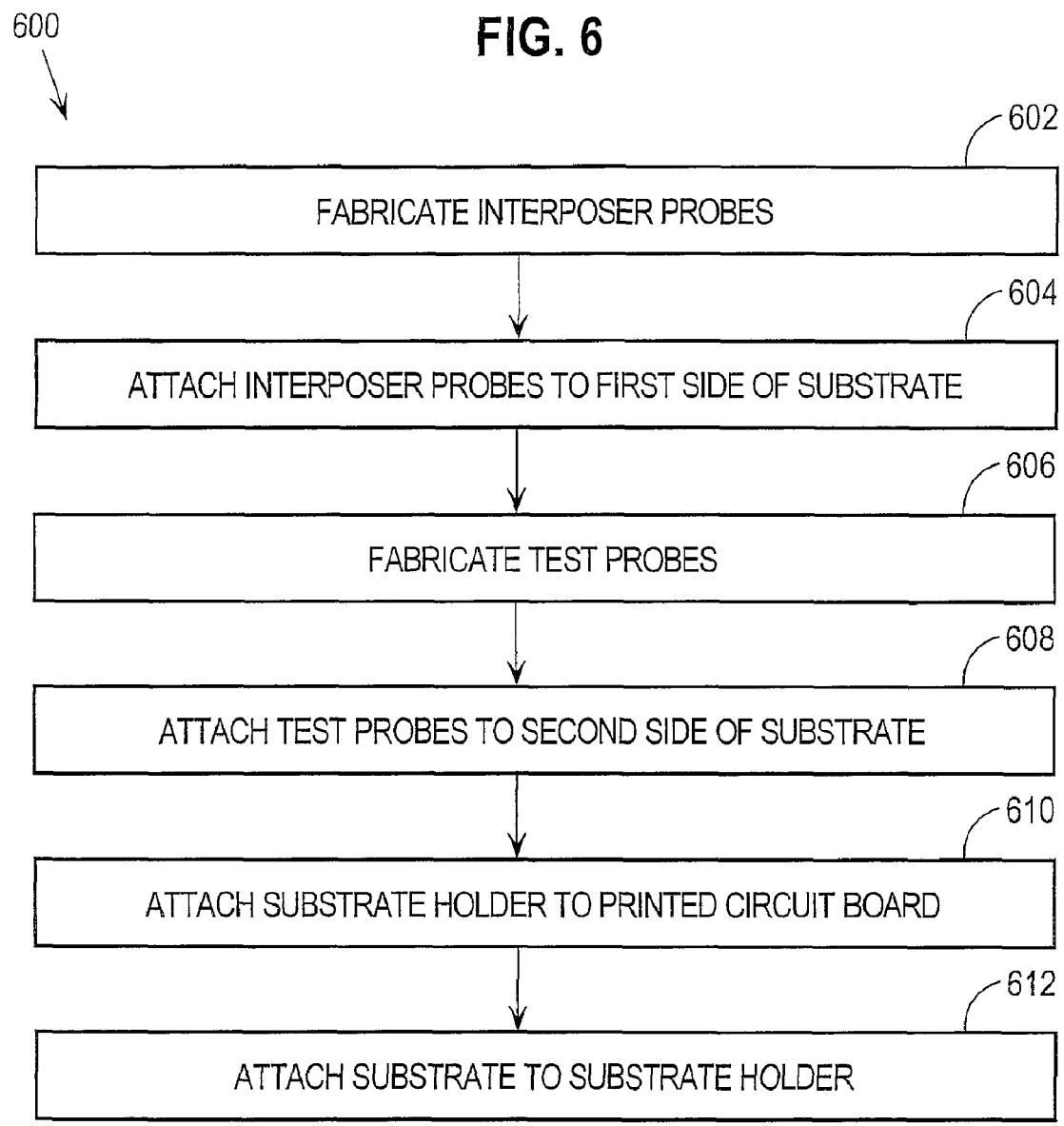

PROBE CARD ASSEMBLY WITH INTERPOSER PROBES

FIELD OF THE INVENTION

This invention relates generally to integrated circuit testing using probe cards.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical connection is established between automatic test equipment (ATE) and each IC formed on the wafer to demonstrate proper performance of the IC's. Components that may be used in wafer testing include an ATE test board, which is a multilayer printed circuit board that is connected to the ATE, and that transfers the test signals between the ATE and a probe card assembly. The probe card assembly (or probe card) includes a printed circuit board that generally contains several hundred probe needles (or "probes") positioned to establish electrical contact with a series of connection terminals (or "die contacts") on the IC wafer. Conventional probe card assemblies include a printed circuit board, a substrate or probe head having a plurality of flexible probes attached thereto, and an interposer that electrically connects the probes to the printed circuit board. The interposer conventionally includes telescopic "pogo pins" or solder bumps that provide electrical connections between conductive pads on the printed circuit board and the interposer and between the interposer and conductive pads on the substrate. The probes are conventionally mounted to electrically conductive, typically metallic, bonding pads on the substrate using wire bonding or wedge bonding techniques The pogo pin or solder bump connections used with conventional probe card assemblies have some significant limitations. For example, pogo pins use spring components that exert a high aggregate amount of force when used in large numbers. The spring components used in pogo pins can also stick or wear out over time, resulting in a "floating contact." Pogo pins are also generally very labor intensive to install, especially in high density applications, and do not have high planarity. They have high deflection capability but their coplanarity is poor. Thus, pogo pins are not a scaleable solution for higher density applications. Solder bumps do not have the same spring component-related problems as pogo pins, but solder bumps sometimes do not provide reliable electrical contact, resulting in floating contacts, i.e., an open circuit. Also, solder bumps are not readily repairable, since they are normally created using solder flow techniques that cannot be used to repair an individual solder bump.

Based on the foregoing, there is a need for a probe card assembly that does not suffer from limitations of conventional probe card assemblies.

BRIEF DESCRIPTION OF THE DRAWINGS

In the figures of the accompanying drawings like reference numerals refer to similar elements.

FIG. 6 is a flow diagram that depicts and approach for making a probe test card assembly with interposer probes according to an embodiment of the invention.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Various aspects of the invention are described hereinafter in the following sections:

I. OVERVIEW
II. PROBE CARD ASSEMBLY WITH INTERPOSER PROBES
III. INTERPOSER PROBES
IV. INTERPOSER PROBE GROUPS
V. HARDSTOPS
VI. MAKING A PROBE TEST CARD ASSEMBLY WITH INTERPOSER PROBES

I. Overview

A probe test card assembly for testing of a device under test includes interposer probes to connect a printed circuit board to a substrate. The probe test card assembly includes a printed circuit board, a substrate and a substrate holder. A plurality of test probes is connected to the substrate for making electrical contact with the device under test. In place of a conventional interposer with pogo pins or solder bumps, the probe test card assembly includes a plurality of interposer probes attached to the substrate for providing electrical connections between the substrate and the printed circuit board. The substrate holder holds the substrate in position with respect to the printed circuit board so that the interposer probes contact the printed circuit board. The probe test card with interposer probes as described herein has several benefits over conventional probe test cards. For example, the interposer probes provide electrical contacts between the printed circuit board and the substrate with a minimal, but adequate, amount of force to provide scrubbing of pads or contacts on the printed circuit board. Furthermore, the interposer probes can be made in large batches using area array fabrication techniques to reduce fabrication costs. Embodiments of the invention also include arranging the interposer probes in interposer probe groups to facilitate maintenance and replacement of interposer probes. Hardstop elements may also be used to protect the interposer probes.

II. Probe Card Assembly With Interposer Probes

Figure 1:
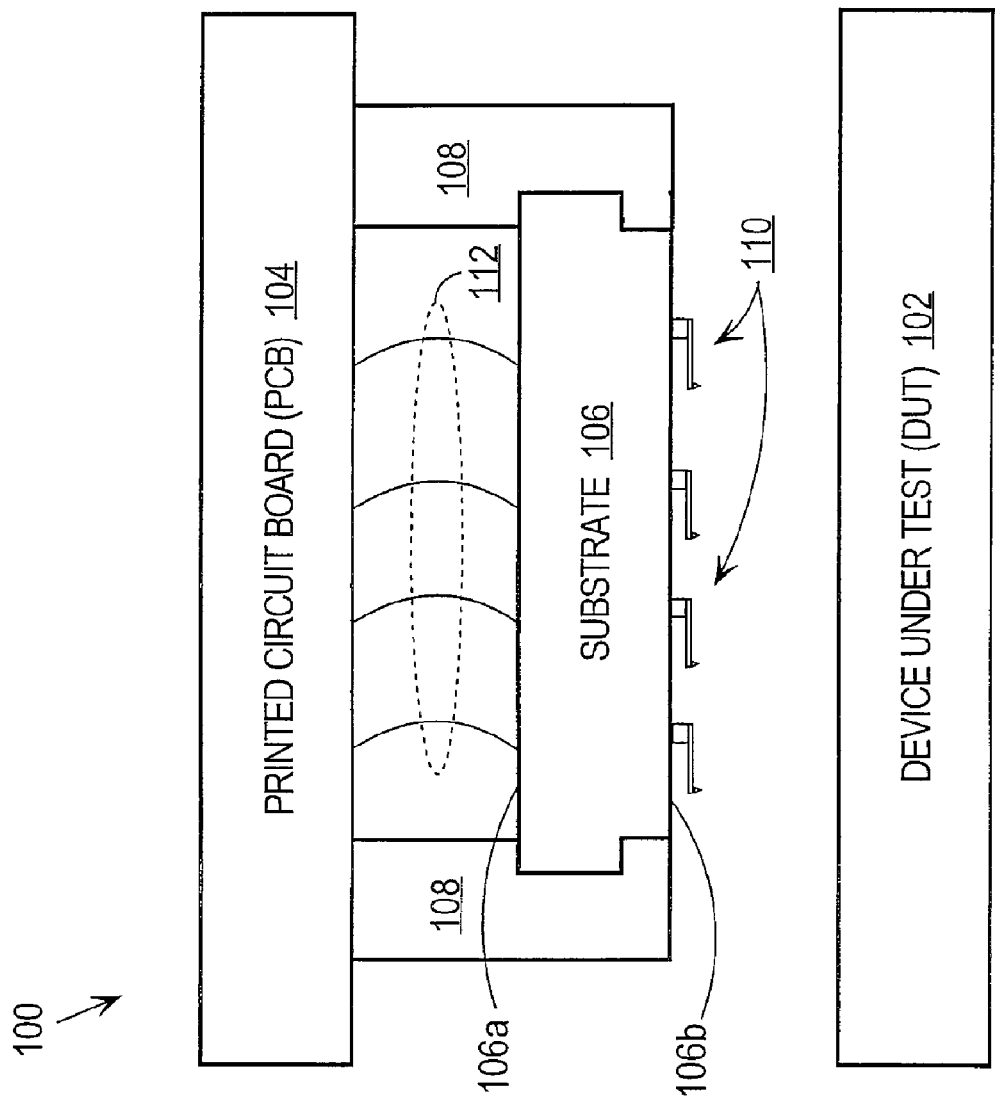
FIG. 1 is a block diagram that depicts a probe card assembly with interposer probes configured to provide testing of a device under test (DUT), according to one embodiment of the invention.

FIG. 1 is a block diagram that depicts a probe card assembly 100 with interposer probes configured to provide testing of a device under test (DUT) 102, according to one embodiment of the invention. Probe card assembly 100 includes a printed circuit board (PCB) 104 and a substrate 106 held in position via a substrate holder 108. PCB 104 is configured with circuitry for testing DUT 102. The substrate 106 includes a first side 106a that substantially faces the PCB 104 and a second side 106b that substantially faces the DUT 102. A set of test probes 110 is attached to the second side 106b of the substrate 106 and during testing is aligned with respective pads or contacts on DUT 102. Substrate 106 may be one or more layers and one example of substrate 106 is a ceramic layer. Instead of a single element, substrate 106 may also be comprised of a set of substrate tiles that together form substrate 106. Although the test probes 110 are depicted in FIG. 1 as cantilever style test probes, this style of test probe is provided for explanation purposes only and any type of test probe may be used, for example, vertical test probes.

According to one embodiment of the invention, a set of interposer probes 112 is attached to the first side 106a of the substrate 106 and makes contact with the PCB 104. The interposer probes 112 provide electrical connections, for example, signal, power, ground, etc., between PCB 104 and substrate 106. The interposer probes 112 are described in more detail hereinafter. Substrate 106 includes electrical paths between the first side 106a, where the interposer probes 112 are attached, and the second side 106b, where the test probes 110 are attached. The electrical paths may be implemented in a variety of ways, depending upon a particular implementation. For example, the electrical paths may be implemented by vias and/or traces on and/or through substrate 106.

Substrate holder 108 may be implemented by any mechanism that holds the substrate 106 relative to the PCB 104 so that the interposer probes 112 make contact with the PCB 104. Although substrate holder 108 is depicted in FIG. 1 being configured with a notch for receiving tongues of substrate 106, substrate holder 108 may have a wide variety of configurations and this particular tongue-and-groove configuration is but one example. Furthermore, substrate holder 108 may be permanently or removeably attached to either PCB 104 or substrate 106.

III. Interposer Probes

Figure 2A:
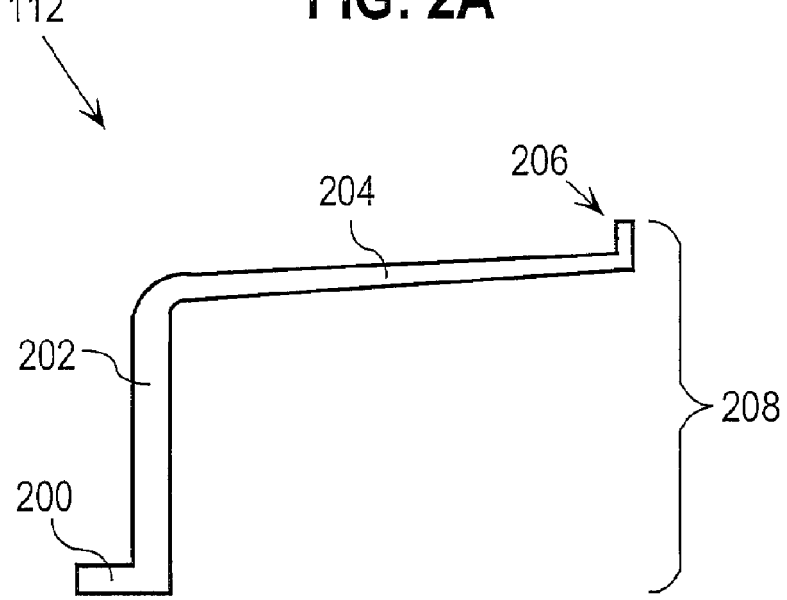
FIG. 2A is a diagram that depicts an example interposer probe.

Interposer probes 112 may have a wide variety of physical characteristics that may vary depending upon a particular implementation. For example, interposer probes 112 may have a wide variety of shapes, such as straight, bent, curved, etc. As another example, interposer probes 112 may have uniform or varying thickness or cross sectional area. FIG. 2A is a diagram that depicts an example interposer probe 112. In this example, interposer probe 112 includes a base portion 200 for attaching the interposer probe 112 to substrate 106. The interposer probes 112 may be connected to substrate 106 using a wide variety of techniques. For example, interposer probes 112 may be bonded to pads or other structures on substrate 106 using, for example, tab or wedge bonding. The bonding of interposer probes 112 to the first side 106a of the substrate 106 may be done at increased temperature, or may be done at room temperature, depending upon the particular technique used. Interposer probe 112 also includes a post portion 202, a beam portion 204 and a tip portion 206. The tip portion 206 makes contact with the PCB 104 and more specifically, a pad on PCB 104. The tip portion 206 may be any shape. Example shapes include, without limitation, pointed or wedge shape. The top portion 206 may also be a stacked or unstacked tip portion 206. Interposer probes 112 may be fabricated in different sizes, depending upon a particular implementation. According to one embodiment of the invention, interposer probes are fabricated with a height 208 of between about 10 mils (0.010 inches) to 200 mils (0.200 inches). According to another embodiment of the invention, interposer probes 112 are fabricated with a height 208 of about 90 mils (0.090 inches).

According to one embodiment of the invention, interposer probes 112 are flexible elements that provide a spring force when brought into contact with PCB 104. This provides a scrubbing action that aids in removing oxidation that may have formed on the pads or other contact areas of PCB 104, which provides a better electrical contact. An example force per interposer probe 112 is in the range of about 4 grams to about 7 grams. This is significantly less than conventional pogo pins that have a force of about 20 grams per pin and allows for a greater number of interposer probes 112 to be used.

Figure 2B:
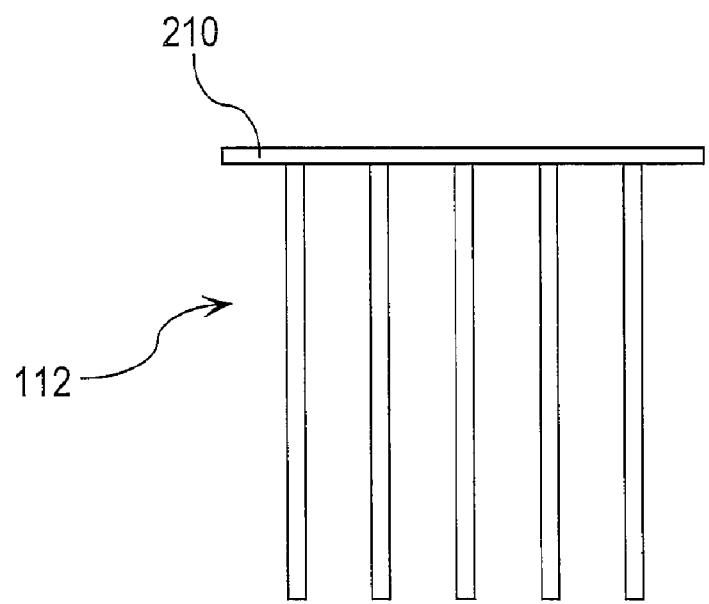
FIG. 2B depicts a top view of a set of interposer probes fabricated connected to a tie bar.

Interposer probes 112 may be fabricated using a wide variety of techniques, depending upon a particular implementation. According to one embodiment of the invention, interposer probes 112 are fabricated in batches using area array semiconductor fabrication techniques. For example, electro forming processes may be used to form interposer probes 112 in rows with a tie bar connecting the base portions 200. The interposer probes 112 may then be held by the tie bar or other carrier mechanism for positioning and attachment to substrate 106. Alternatively, the interposer probes 112 may be cut from the tie bar and attached individually to substrate 106. FIG. 2B depicts a top view of a set of interposer probes 112 fabricated connected to a tie bar 210.

Figure 3B:
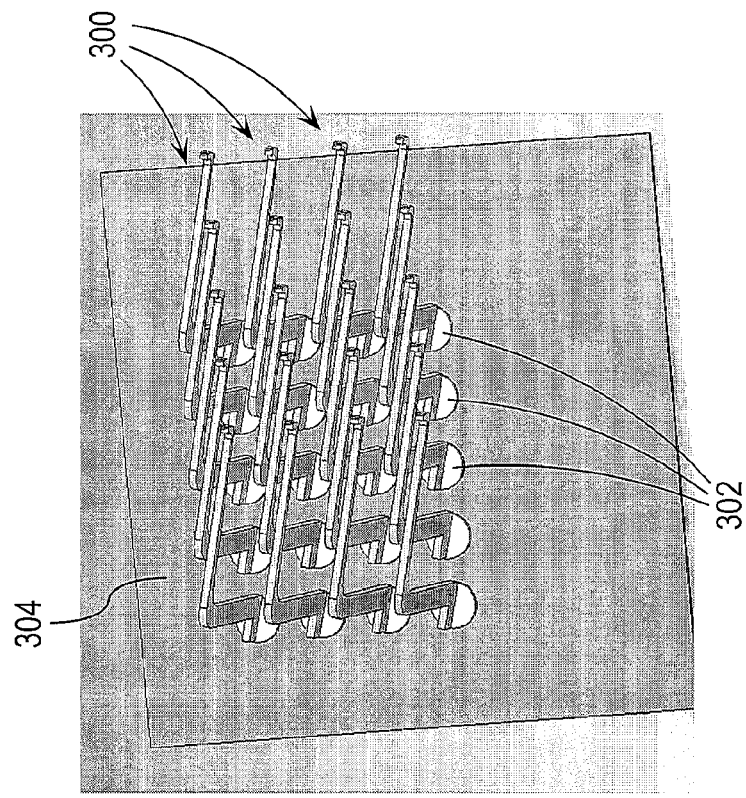
FIG. 3B depicts a side view of a set of interposer probes attached to a set of pads on a substrate.
Figure 3A:
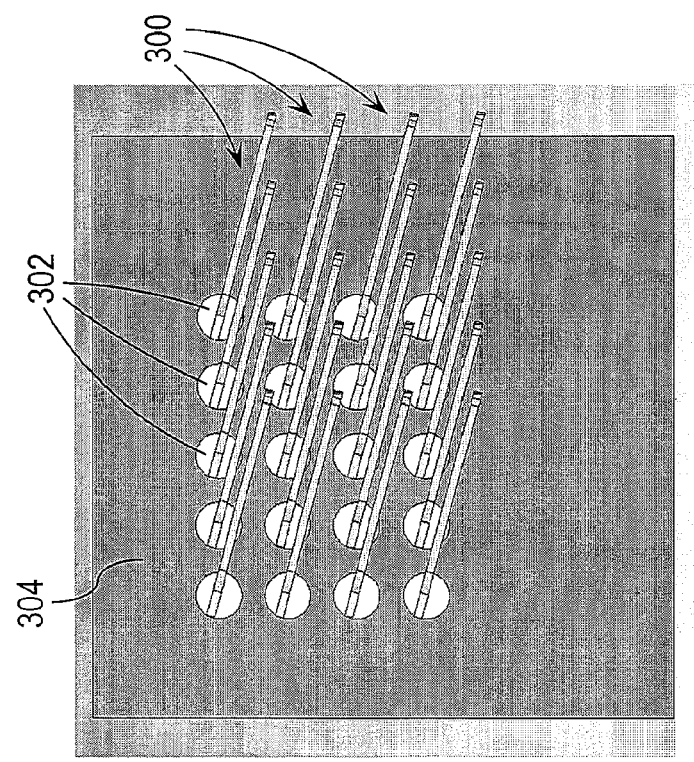
FIG. 3A depicts a top view of a set of interposer probes attached to a set of pads on a substrate.

FIGS. 3A and 3B depict a top view and side view, respectively, of a set of interposer probes 300 attached to a set of pads 302 on a substrate 304. In this example, the pads 302 are round in shape and have a diameter of approximately 0.020 inches. The approach is not limited to this example and the pads 302 may have different diameters and shapes, depending upon a particular implementation. For example, the pads 302 may be rectangular in shape. Also, the interposer probes 300 are attached to substrate 304 at a pitch of approximately 0.030 inches. This arrangement provides favorable planarity characteristics and high density where needed. The arrangement also provides variable probe depth to accommodate a wide variety of applications. Referring to FIG. 1, the probe depth is the distance from the tips of test probes 110 to the tips of interposer probes 112 at the point of contact with PCB 104. According to one embodiment of the invention, the probe depth is in the range of approximately 250 to 450 mils (0.250 to 0.450 inches).

Interposer probes 112 may be made from a wide variety of materials. Examples of suitable materials include, without limitation, nickel alloys, aluminum and copper. Interposer probes 112 may include coatings along any portion or their entire length. For example, the base portion 200 may be coated with gold, aluminum, copper or some other conductive material to provide a good electrical connection to substrate 106. The coating of base portion 200 may also provide a better bond of the interposer probes 112 to the substrate 106. The tip portions 206 of the interposer probes 112 may also be coated with a conductive material to provide a good electrical connection with pads on PCB 104. For example, the tip portions 206 may be coated with gold, rhodium, palladium alloys, platinum alloys, or other harder materials or alloys.

Test probes 110 do not necessarily need to be attached directly to the second side 106b of substrate 106. According to one embodiment of the invention, one or more interposer structures may be used in between substrate 106 and test probes 110. For example, the second side 106b of substrate 106 may be fabricated with solder balls, pads or other conductive structures instead of test probes 110. An interposer structure may then be disposed against the second side 106b of substrate 106 and test probes 110 attached to an opposite side of the interposer structure. As another example, a probe head may be connected to the second side 106b of substrate 106 and the test probes 110 attached to the probe head.

IV. Interposer Probe Groups

Contemporary area array fabrication techniques allow interposer probes 300 to be attached in close proximity to each other on substrate 304. This allows a very high interposer probe density, which can be beneficial in certain situations. Interposer probes sometimes need to be repaired or replaced however, because of wear, breaking or inadvertent contact with an object. Repairing or replacing interposer probes that are in very close proximity with other interposer probes can be difficult and in some situations can require replacement of all of the interposer probes attached to a substrate. For example, the close spacing of interposer probes may not provide sufficient room to access and repair an interposer probe disposed in the middle of an array of interposer probes without having to replace all the interposer probes in the array. In some cases, some special gaps between pins are needed to place components, such as capacitors, on an interposer, such as a multi-layer ceramic.

Figure 4A:
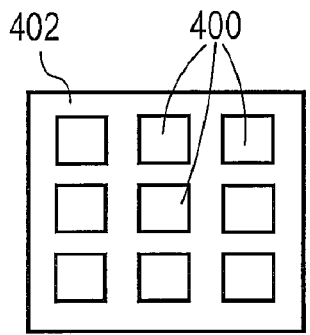
FIG. 4A depicts a top view of interposer probe groups attached to a substrate.
Figure 4B:
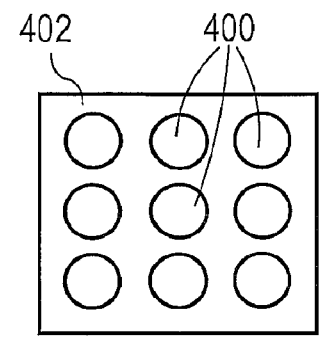
FIG. 4B depicts circle-shaped interposer probe groups.
Figure 4C:
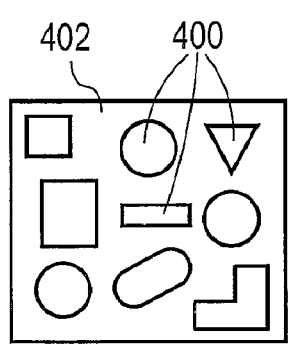
FIG. 4C depicts interposer probe groups formed in a variety of shapes.

According to one embodiment of the invention, interposer probes 112 are attached to substrate 106 in groups to provide improved access for maintenance and replacement. FIG. 4A depicts a top view of interposer probe groups 400 attached to a substrate 402. Each interposer probe group 400 may include any number of interposer probes, depending upon a particular implementation. For example, each interposer probe group 400 may include one hundred interposer probes, e.g., in a ten by ten pattern. Although the interposer probe groups 400 are depicted in FIG. 4A as being grouped into square-shaped interposer probe groups, the approach is not limited to square-shaped interposer probe groups and interposer probes may be formed and arranged in any shape or pattern. For example, FIG. 4B depicts circle-shaped interposer probe groups 400. As another example, FIG. 4C depicts interposer probe groups 400 formed in a variety of shapes. Any size and shape of interposer probe groups 400 may be used, depending upon a particular implementation.

The spaces between the interposer probe groups 400 provides access by a tool used to remove and replace interposer probes and limits the interposer probes that have to be replace to the interposer probes in a single interposer probe group 400. One example spacing is in the range of approximately 90 to approximately 150 mils (0.090 to 0.150 inches). The interposer probe groups 400 are depicted in FIG. 4A as having approximately equal spacing between the interposer probe groups 400, but this is not required and different spacings may be used between different interposer probe groups 400, depending upon a particular implementation. For example, FIG. 4C depicts interposer probe groups 400 having different spacings between them.

V. Hardstops

Figure 5A:
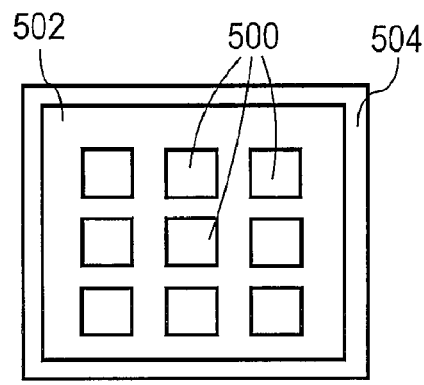
FIG. 5A depicts a top view of an example interposer probe arrangement that includes a hardstop element for protecting interposer probes.
Figure 5B:
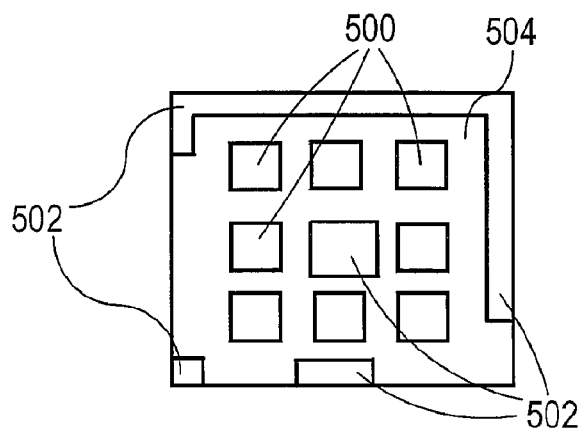
FIG. 5B depicts several hardstop elements disposed on the interior and the periphery of substrate 502.

Like conventional probes, interposer probes are generally very small and delicate devices that are easily damaged during installation or transport of a substrate to which they are attached. According to one embodiment of the invention, the substrate to which the interposer probes are attached includes one or more hardstop elements for protecting the interposer probes. FIG. 5A depicts a top view of an example interposer probe arrangement that includes a hardstop element for protecting interposer probes. In FIG. 5A, a set of interposer probe groups 500 are attached to substrate 502. A hardstop element 504 is formed around interposer probe groups 500 and protects interposer probe groups 500 from being damaged. A hardstop typically has lower height than those of interposer probes to allow enough probe deflection room for a good contact. The difference in height is determined by the limit on allowable elastic deflection of interposer probes. Although hardtop element 504 is depicted as a rectangular structure formed around the periphery of the substrate 502, the approach is not limited to this type of structure and hardstop elements 504 having a wide variety of shapes and sizes may be used. For example, as depicted in FIG. 5B, several hardstop elements are depicted, some in the interior and some on the periphery of substrate 502. According to one embodiment of the invention, hardstop elements 504 are removeably attached to substrate 502. This allows substrate 502 to be positioned within a substrate holder and then the hardstop elements 504 removed. The hardstop elements 504 may also be removed prior to the substrate 502 being positioned within a substrate holder. Alternatively, the hardstop elements 504 may be left in place, which may provide an additional benefit of reducing the aggregate force provided by the interposer probes.

VI. Making a Probe Test Card Assembly With Interposer Probes

FIG. 6 is a flow diagram 600 that depicts and approach for making a probe test card assembly with interposer probes according to an embodiment of the invention. Referring to FIG. 1 and FIG. 6, in step 602, interposer probes 112 are fabricated. As previously described herein, interposer probes 112 may be fabricated using area array techniques either individually or in groups, and may be fabricated on a tie bar. In step 604, the interposer probes 112 are attached to the first side of the substrate 106. For example, the interposer probes 112 may be attached to conductive pads on the substrate 106. In step 606, the test probes 110 are fabricated. As previously described herein, the test probes 110 may be any type of probe, such as a cantilever or vertical type of probe, and may be fabricated using any probe fabrication technique. In step 608, the test probes 110 are attached to the second side of the substrate 106. For example, the test probes 110 may be attached to conductive traces or pads on the second side of the substrate 106. Note that the interposer probes 112 and test probes 110 may be attached to the substrate 106 in the other order. For example, the test probes 110 may be attached first to the substrate 106, followed by the interposer probes 112.

In step 610, the substrate holder 108 is attached to the PCB 104. In step 612, the substrate 106 is attached to the substrate holder 108 in a manner so that the interposer probes 112 contact the PCB 104. Alternatively, the substrate 106 may first be attached to the substrate holder 108, followed by the substrate holder 108, with the substrate 106, being attached to the PCB 104.

In the foregoing specification, embodiments of the invention have been described with reference to numerous specific details that may vary from implementation to implementation. Thus, the sole and exclusive indicator of what is, and is intended by the applicants to be the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A probe test card assembly comprising:
   a printed circuit board having a first side and a second side;
   a substrate having a first side and a second side, the first side substantially facing the second side of the printed circuit board;
   a plurality of interposer probes directly attached to the substrate and directly contacting the printed circuit board, wherein each interposer probe from the plurality of interposer probes includes a base portion and a tip portion at opposite ends of the interposer probe, the base portion being attached to the first side of the substrate and the tip portion being in contact with the second side of the printed circuit board;
   a substrate holder for holding the substrate relative to the printed circuit board so that the tip portions of the plurality of interposer probes make contact with the second side of the printed circuit board; and
   a plurality of test probes attached to the second side of the substrate for making electrical contact with a device under test.

2. The probe test card assembly recited in claim 1, wherein the plurality of interposer probes is arranged and attached to the first side of the substrate in two or more interposer probe groups, wherein spaces are provided between the two or more interposer probe groups to allow access to the plurality of interposer probes.

3. The probe test card assembly recited in claim 2, wherein at least two of the two or more interposer probe groups have different characteristics.

4. The probe test card assembly recited in claim 3, wherein the different characteristics include one or more of a number of probes in each interposer probe group, a shape of each interposer probe group and a spacing of interposer probes within each interposer probe group.

5. The probe test card assembly recited in claim 1, wherein the plurality of interposer probes comprise one or more of nickel alloy and copper.

6. The probe test card assembly recited in claim 1, wherein the tip portions of the plurality of interposer probes comprise one or more of gold, rhodium, palladium alloys, platinum alloys or other harder materials and alloys.

7. The probe test card assembly recited in claim 1, further comprising one or more hardstop elements removeably attached to the first side of the substrate to protect the plurality of interposer probes.

8. The probe test card assembly recited in claim 1, wherein the substrate is a ceramic substrate having one or more layers.

9. The probe test card assembly recited in claim 1, wherein the base portions of the plurality of interposer probes are attached to one or more pads formed on the first side of the substrate and the tip portions of the plurality of interposer probes contact one or more pads formed on the printed circuit board.

10. The probe test card assembly recited in claim 1, wherein the plurality of interposer probes is a plurality of flexible interposer probes and the substrate holder holds the substrate relative to the printed circuit board so that the plurality of interposer probes is at least partially flexed when the interposer probes make contact with the second side of the printed circuit board.

11. A method for manufacturing a probe test card assembly comprising:
    directly connecting a substrate to a printed circuit board by attaching a plurality of interposer probes to a first side of the substrate so that the plurality of interposer probes directly connects the substrate to the printed circuit board, wherein each interposer probe from the plurality of interposer probes includes a base portion and a tip portion at opposite ends of the interposer probe, the base portion being attached to the first side of the substrate and the tip portion being in contact with a second side of the printed circuit board;
    attaching a substrate holder to the substrate and the printed circuit board for holding the substrate relative to the printed circuit board so that the tip portions of the plurality of interposer probes make contact with the second side of the printed circuit board; and
    attaching a plurality of test probes to a second side of the substrate for making electrical contact with a device under test.

12. The method recited in claim 11, further comprising arranging the plurality of interposer probes on the first side of the substrate in two or more interposer probe groups, wherein spaces are provided between the two or more interposer probe groups to allow access to the plurality of interposer probes.

13. The method recited in claim 12, wherein at least two of the two or more interposer probe groups have different characteristics.

14. The method recited in claim 13, wherein the different characteristics include one or more of a number of probes in each interposer probe group, a shape of each interposer probe group and a spacing of interposer probes within each interposer probe group.

15. The method recited in claim 11, wherein the plurality of interposer probes comprise one or more of nickel alloy, copper, BeCu, Pt or Pd-containing alloys.

16. The method recited in claim 11, wherein the tip portions of the plurality of interposer probes comprise one or more of gold, Rh or Pd-based alloys.

17. The method recited in claim 11, further comprising removeably attaching one or more hardstop elements to the first side of the substrate to protect the plurality of interposer probes.

18. The method recited in claim 11, wherein the substrate is a ceramic substrate having one or more layers.

19. The method recited in claim 11, further comprising attaching the base portions of the plurality of interposer probes to one or more pads formed on the first side of the substrate and wherein the tip portions of the plurality of interposer probes contact one or more pads formed on the printed circuit board.

20. The method recited in claim 11, wherein the plurality of interposer probes is a plurality of flexible interposer probes and the substrate holder holds the substrate relative to the printed circuit board so that the plurality of interposer probes is at least partially flexed when the interposer probes make contact with the second side of the printed circuit board.

* * * * *